US005675302A

United States Patent [19]

Howard et al.

[11] Patent Number: 5,675,302
[45] Date of Patent: Oct. 7, 1997

[54] MICROWAVE COMPRESSION INTERCONNECT USING DIELECTRIC FILLED THREE-WIRE LINE WITH COMPRESSIBLE CONDUCTORS

[75] Inventors: Claudio S. Howard, Hawthorne; Rick L. Sturdivant, Placentia; Clifton Quan, Arcadia; John J. Wooldridge, Manhattan Beach, all of Calif.

[73] Assignee: Hughes Electronics, Los Angeles, Calif.

[21] Appl. No.: 632,865

[22] Filed: Apr. 16, 1996

Related U.S. Application Data

[63] Continuation-in-part of Ser. No. 458,839, Jun. 2, 1995, Pat. No. 5,552,752.
[51] Int. Cl.⁶ .................................. H01P 3/00; H01P 5/00
[52] U.S. Cl. ............................................... 333/243; 333/260
[58] Field of Search ........................................ 333/243, 236, 333/260, 246; 174/90, 128.1; 439/66, 449, 930

[56] References Cited

U.S. PATENT DOCUMENTS

| | | | |
|---|---|---|---|
| 4,556,265 | 12/1985 | Cunningham | 333/260 X |
| 4,686,492 | 8/1987 | Grellmann et al. | 333/246 X |
| 5,349,317 | 9/1994 | Notani et al. | 333/236 |
| 5,552,752 | 9/1996 | Sturdivant et al. | 333/243 |

OTHER PUBLICATIONS

"Array Module Connector Test Program at Unisys," R.J. Kuntz, S. Williams, MCM '94 Proceedings, pp. 498–503 no month.
"CIN::APSE Standard Products," Cinch Connector Division no date.
"A Modified PTFE Microwave Circuit Substrate," R.J. Bonfield, MSN & Communications Technology, Feb. 1988.

*Primary Examiner*—Paul Gensler
*Attorney, Agent, or Firm*—Leonard A. Alkov; Wanda K. Denson-Low

[57] ABSTRACT

A microwave frequency three-wire transmission line provides the capability of solderless interconnections between stacked microwave hybrid and printed wiring board (PWB) assemblies. Three wire-like compressible conductors are embedded in a dielectric support member. Each compressible conductor is realized by densely packing thin wire into an opening in the supporting dielectric. The dielectric preferably has a metal shielding surrounding the outer periphery to suppress higher order modes. A vertical right angle bend transition uses the transmission line to interconnect between grounded coplanar waveguide (GCPW) transmission lines. This orthogonal transition uses button spring contacts, thus creating a reusable solderless vertical interconnection between the two transmission lines. This transition can operate from DC to greater than 15 GHz with good match and low loss, and allows a transition from a GCPW transmission line on a first substrate to another GCPW transmission line on a second substrate stacked above the first substrate.

18 Claims, 3 Drawing Sheets

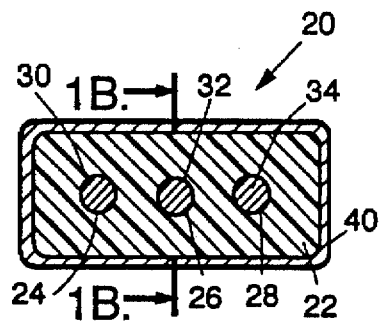
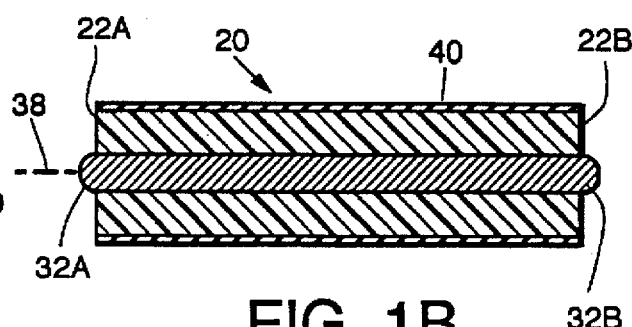
FIG. 1A.  FIG. 1B.
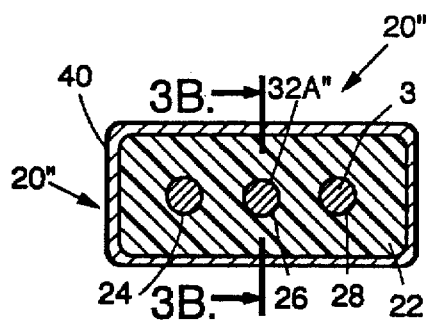
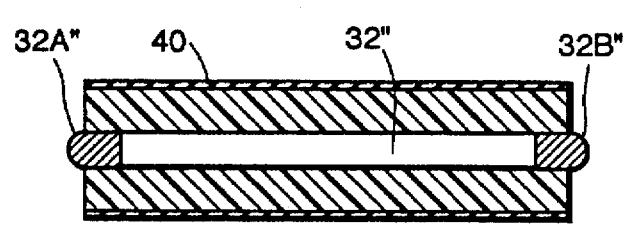
FIG. 3A.  FIG. 3B.
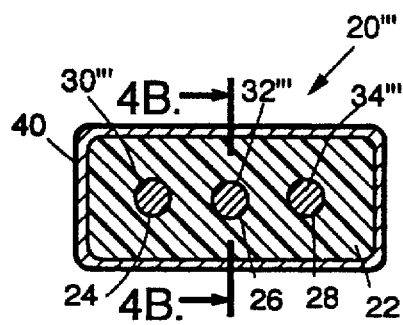
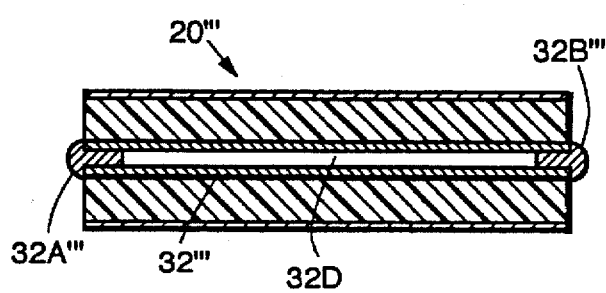
FIG. 4A.  FIG. 4B.

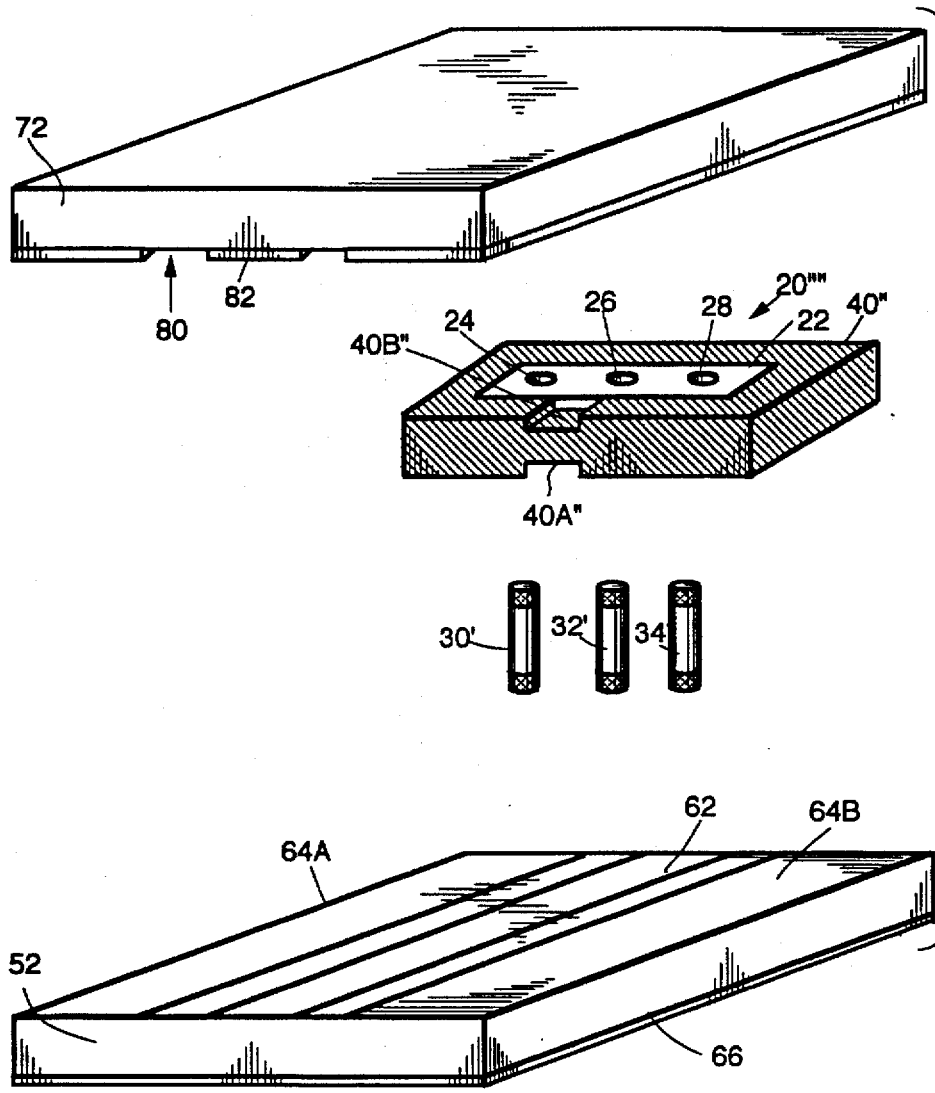
FIG. 7.
FIG. 5.
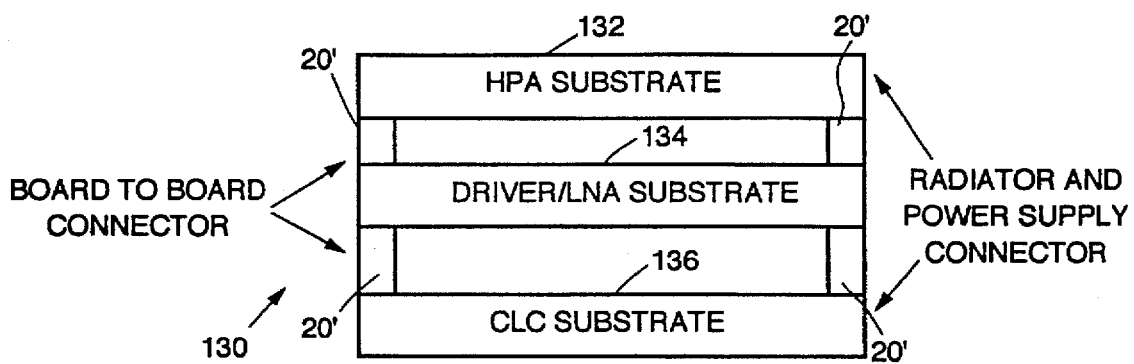

MICROWAVE COMPRESSION INTERCONNECT USING DIELECTRIC FILLED THREE-WIRE LINE WITH COMPRESSIBLE CONDUCTORS

This is a continuation-in-part of application Ser. No. 08/458,839, filed Jun. 2, 1995, entitled "Microwave Vertical Interconnect Trough Circuit With Compressible Conductor," by R. L. Sturdivant et al., U.S. Pat. No. 5,552,752 the entire contents of which are incorporated herein by this reference.

TECHNICAL FIELD OF THE INVENTION

This invention relates to RF interconnection devices, and more particularly to microwave compression interconnects using dielectric filled three-wire line.

BACKGROUND OF THE INVENTION

There is a need in many microwave applications for providing RF interconnections between adjacent circuit boards. Conventional techniques for interconnecting circuit boards include the use of cables. The disadvantages to these methods include increased size, weight, and cost.

This invention offers a new, compact approach to microwave packaging. Separate, individual hybrids and RF electronic subsystem assemblies can now be packaged vertically, saving valuable real estate. Other techniques for providing vertical bends in interconnections require several process steps and a more permanent attachment such as epoxies and solders.

This invention provides the capability to create low cost, easy to assemble and easy to repair multi-layered stacked microwave hybrid assemblies. Other transmission interconnects require a more permanent attachment such as solders and epoxies and have narrower operating frequency bandwidth.

SUMMARY OF THE INVENTION

One aspect of the invention is a three-wire microwave transmission line with compressible conductor portions. The three-wire line includes a dielectric element having formed therein first, second and third openings extending from a first end of the dielectric element to a second end of the dielectric element. First, second and third conductors are disposed respectively within the first, second and third openings, the conductors including respectively first, second and third compressible conductor members. These compressible conductor members are formed of thin metal wire densely packed within the respective openings. The compressible conductor members each including a first end protruding from the respective openings to form a first set of compressible contacts at the first dielectric end.

In one embodiment of the three-wire line, each of the first, second and third conductors is defined by the respective compressible member, and the compressible members extends through the respective first, second and third opening from the first dielectric end to the second dielectric end. Each of the compressible members protrudes from the second dielectric end to define a second set of compressible contacts at the second dielectric end.

In another embodiment of the three-wire line with compressible contacts, the first, second and third conductors respectively further include first, second and third rigid conductor members disposed within the respective first, second and third openings, and each having a first end in a compression fit with a first end of a corresponding compressible element.

The three-wire line with compressible contacts may be used as a vertical interconnect to electrically connect RF transmission lines on stacked microwave circuits. Thus, for example, a stacked assembly of microwave circuits formed on substrates includes a first microwave circuit comprising a first substrate having defined on a first substrate surface a first grounded coplanar waveguide (GCPW) transmission line. A second microwave circuit comprises a second substrate having defined on a second substrate surface a second GCPW transmission line. An interconnection circuit provides an orthogonal microwave transition between the first and second GCPW transmission lines, and includes a dielectric element having formed therein first, second and third openings extending from a first end to a second end of the dielectric element. First, second and third conductors are disposed respectively within the first, second and third openings. The conductors include respectively first, second and third compressible conductor portions, each including a first end protruding from the respective openings to form a first set of compressible contacts at the first dielectric end. The conductors further including respective fourth, fifth and sixth compressible conductor portions each including a first end protruding from the respective openings to form a second set of compressible contacts at the second dielectric end. The first and second substrates sandwich the interconnection circuit so that the first set of compressible contacts of the three-wire transmission line is in compressive electrical contact with corresponding ground plane surfaces and a center conductor comprising the first GCPW line. The second set of compressible contacts of the three-wire transmission line is in compressive electrical contact with corresponding ground plane surfaces and a center conductor comprising the second GCPW line.

BRIEF DESCRIPTION OF THE DRAWING

These and other features and advantages of the present invention will become more apparent from the following detailed description of an exemplary embodiment thereof, as illustrated in the accompanying drawings, in which:

FIG. 1A is an end cross-sectional view taken of a three-wire transmission line with compressible conductors embodying one aspect of this invention. FIG. 1B is a side cross-sectional view of the transmission line of FIG. 1A, taken along line 1B–1B of FIG. 1A.

FIG. 3A is an end cross-sectional view of a first alternative embodiment of a three-wire transmission line in accordance with the invention. FIG. 3B is a side cross-sectional view of the transmission line of FIG. 3A, taken along line 3B–3B of FIG. 3A.

FIG. 4A is an end cross-sectional view of a second alternative embodiment of a three-wire transmission line in accordance with the invention. FIG. 4B is a side cross-sectional view of the transmission line of FIG. 4A, taken along line 4B–4B of FIG. 4A.

FIG. 5 illustrates in simplified form an RF module comprising stacked microwave integrated circuit substrate boards interconnected by a plurality of interconnect circuits.

FIG. 7 illustrates an alternate embodiment of an interconnect employing a solid metal shield which encircles the dielectric header element and provides upper sidewall shielding for the GCPW lines.

DETAILED DESCRIPTION OF THE PREFERRED EMBODIMENT

Figure 2:
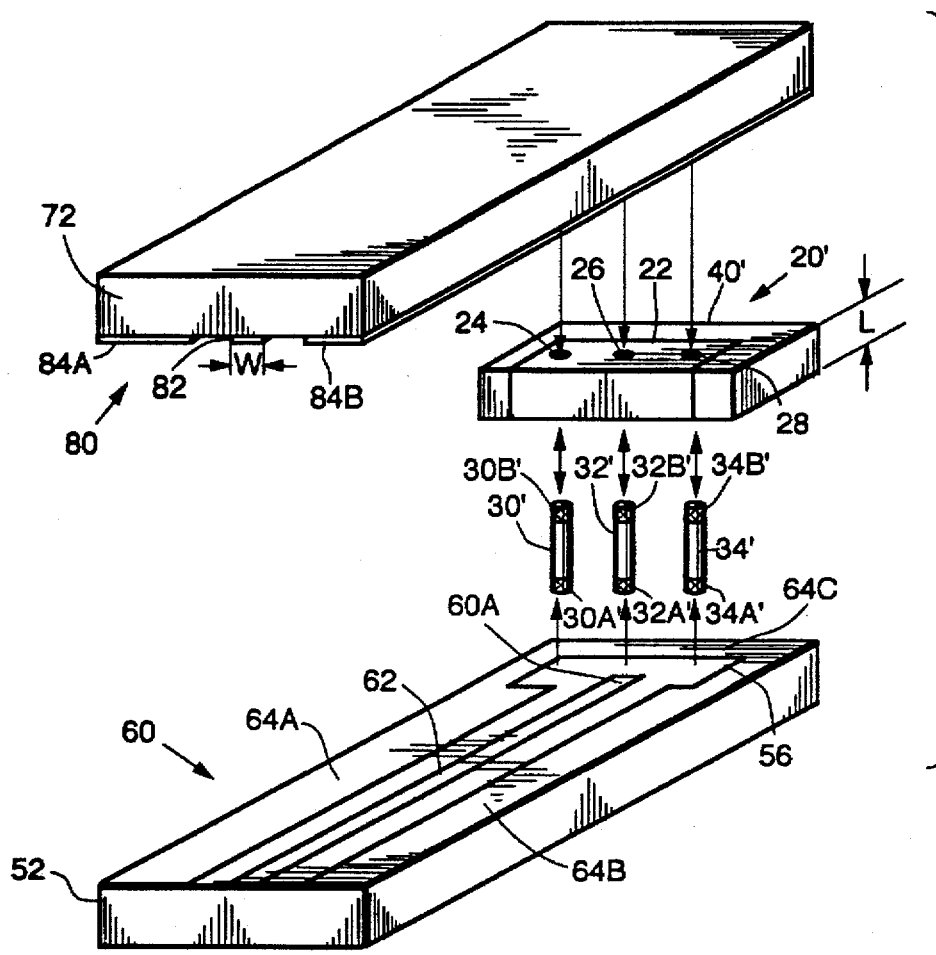
FIG. 2 is an exploded view illustrative of an exemplary embodiment wherein the invention is used in a vertical right angle transition to provide connection between two substrates.

One aspect of this invention is a new type of microwave frequency transmission line, referred to herein as three-wire transmission line with compressible conductors, that provides the capability of solder-less interconnections between stacked microwave hybrid and printed wiring board (PWB) assemblies. These conductors are realized by densely packing thin wire into holes formed in the supporting dielectric to form the compressible conductors.

FIGS. 1A–1B illustrate the new transmission line 20. FIG. 1A is a cross-sectional end view of the line 20, and FIG. 1B is a cross-sectional side view of the line. The line 20 includes a dielectric support member 22 having three aligned cylindrical openings 24, 26, 28 formed therein, and respective conductors 30, 32 and 34 filling the openings.

In accordance with the invention, the conductors 30, 32, 34 are each compressible masses of thin wire densely packed into the respective openings. In an exemplary implementation, the diameter of the wire is on the order of 0.001 to 0.002 inch. Moreover, each conductor extends a short distance from the end edges at 22A and 22B of the dielectric 22 to form compressible, springy button contacts. FIG. 1B shows exemplary button contacts 32A and 32B for the center conductor 32. An exemplary range of this distance is 3–10 mils. These button contacts can then be employed to make electrical contact with conductor lines extending at right angles to the axis 38 Of the transmission line 20, or to make contact with another collinear section of transmission line, for example. The electrical connections are low loss connections at microwave frequencies.

The dielectric material for the support dielectric 22, the diameter of the conductors 30–34 and of the openings 24–28, and the spacing between the openings can be selected to provide a desired characteristic impedance for the transmission line 20. For example, many applications will find it useful to select these parameters to realize a 50 ohm characteristic impedance.

The openings 24–28 formed in the dielectric 22 preferably have a slight taper formed therein at the edges of the dielectric member, in order to provide some open volume into which the mass of the compressible conductors can be compressed as the button contacts, e.g. contacts 32A or 32B are urged into contact with a rigid surface. In practice, the diameter of the opening ends may be about 5% larger than the nominal diameter of the compressible conductors intermediate the edges of the dielectric.

An outer shielding 40 around the transmission line is recommended to prevent the generation of higher order modes, thus limiting the operating frequency band width. These higher order modes are unwanted electromagnetic waves which propagate, typically unwanted TE, TM, LSM (longitudinal section magnetic), LSE (longitudinal section electric) and coupled two wire modes. The outer shielding 40 can be realized using either machined metal or plated metal on dielectric, and is designed to suppress higher order modes while not short circuiting the matching transmission line.

One application for this invention is to carry RF signals between vertically stacked modules, via a low loss, space efficient, low cost vertical transition. Because of the solderless nature of this invention, stacked microwave hybrids and printed wiring board (PWB) assemblies that are easy to assemble and disassemble for rework can be realized. Exemplary applications include vertical interconnects between stacked substrates, which can be found in receiver/exciters, communication subsystems, satellites, microwave automobile electronics, missile systems, other applications where size minimization is important, such as cellular telephones.

Vertical right angle transitions to grounded coplanar waveguide (GCPW) transmission lines can be achieved with this invention. The invention can also form a vertical, right angle transition between substrates and modules with three-wire line inputs and outputs. This type of interconnect can be used with or without external RF shielding such as shielding 40 (FIG. 1A). However, broad frequency band operation is best achieved with an external shield. The shielding helps to eliminate unwanted modes which are a problem at high frequencies. Therefore, for broad band operation, external shielding is suggested.

The field distribution propagating through the three wire line in accordance with the invention is compatible with the field distributions propagating through GCPW, solid conductor three-wire line, slabline and stripline transmission lines. Shielded three-wire line using the compressible conductors in accordance with the invention is low loss and can be well matched to 50 ohms.

To compensate for physical misalignment in the lateral direction between the center conductor traces between the three-wire line interconnect with compressible conductors and the GCPW, the diameter of the compressible center conductor of the interconnect is designed to be less than the GCPW center conductor trace. The spacing between the center and outer compressible conductors within the dielectric support member, e.g. a thermoset plastic marketed by Rogers Corporation as "ROGERS TMM4," having a relative dielectric constant of 4.25, is designed for 50 ohm transmission line, and is physically greater than the dimension consisting of the GCPW center strip and two gaps between the upper ground plane. The resulting RF discontinuities, associated with the dimension differences in the two corresponding transmission lines, are small and can be easily compensated by proper adjustment of the GCPW dimension prior to assembly. For example, the parasitic susceptances of vertical TEM interconnect junctions are typically capacitive. This capacitive junction can be easily compensated by adding some inductance. This is done by increasing the gaps of the GCPW line in the section closest to the junction.

This orthogonal transition uses compressible conductor contacts, thus creating a reusable solder-less vertical interconnection between two horizontally oriented transmission lines. This transition can operate from DC to greater than 15 GHz with good match and low loss, and allows, for example, a transition from a GCPW transmission line on a first substrate to another GCPW transmission line on a second substrate stacked above the first substrate. This aspect of the invention can be extended to stacked multi-layer microwave hybrid assemblies, where the three-wire transmission line can be employed to provide solderless vertical interconnects.

FIG. 2 is an exploded view illustrative of how the invention is used to provide connection between two GCPW transmission lines 60 and 80 on adjacent substrates 52 and 72, illustrative of interconnections between stacked microwave hybrids and PWB assemblies. The substrates 52 and 72 are fabricated of a dielectric material, and have formed on the facing surfaces thereof conductor patterns defining the respective GCPW lines. Thus, GCPW line 60 includes center conductor 62 disposed between and spaced from the ground planes 64A and 64B. GCPW line 80 includes center conductor 82 disposed between and spaced from the ground planes 84A and 84B.

A three-wire interconnection circuit 20' provides a means for RF interconnection between the two GCPW lines 60 and 80. This interconnection circuit is similar to the circuit shown in FIGS. 1A and 1B, except that the dimension of the circuit in the direction of the center conductor axis is shortened, and there is no metal shielding 40' along one side wall 42 of the interconnect circuit. This dimension L of the interconnection circuit 20' establishes the spacing between the substrates 52 and 72 when fully assembled together. The lack of metal shielding along side wall 42 prevents shorting of the GCPW center conductor strips to ground.

Figure 6A:
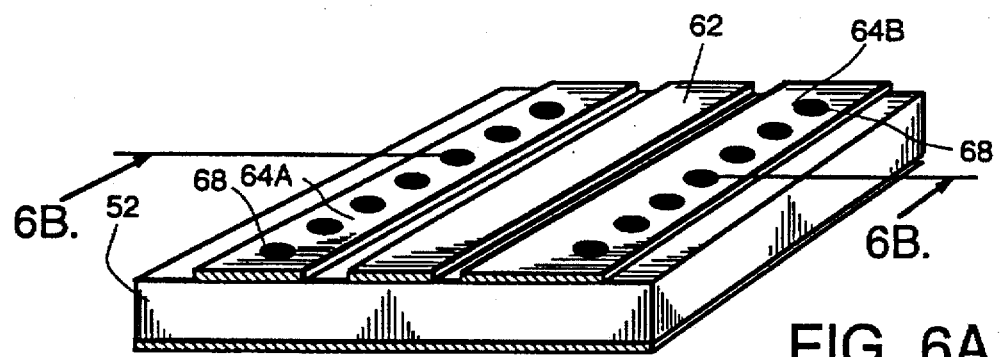
FIGS. 6A and 6B are respective isometric and end views illustrating the metallic vias extending through the substrate and interconnecting the lower ground plane and the ground conductor strips of a GCPW.
Figure 6B:
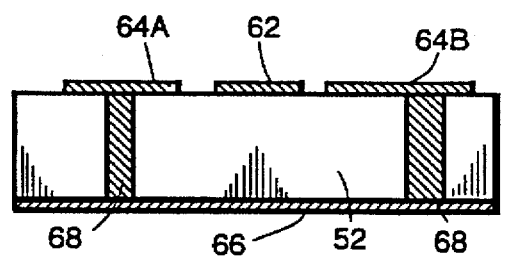

Within the GCPW substrates 52, 72, metalized vias can be incorporated to assure good ground contact between the top and bottom ground planes. FIGS. 6A and 6B illustrate the metallic vias 68 extending through the substrate 52 and interconnecting the lower ground plane 66 and the ground conductor strips 64A and 64B.

In a preferred embodiment, the interconnection circuit 20' is a 50 ohm dielectric-filled three-wire transmission line, comprising the compressible conductors 30', 32' and 34' which are positioned in the openings 24, 26, 28 formed in the dielectric header 22. The diameter of the conductors is slightly smaller than the width W of the GCPW center strips 62 and 82. For example, in an exemplary embodiment, the diameter of the conductors 30'-34' is 20 mils, and the GCPW center conductor strip width is 26 mils. The interconnection circuit 20' is placed over an end 60A of the GCPW 60 such that the compressible conductor contacts 30A', 32A' and 34A' make DC compression contact respectively to the ground conductor 64A, the center conductor 62 and the ground conductor 64B of the GCPW line 60. When the two substrates 52 and 72 are brought against the interconnection circuit 20', the compressible center conductor portion 32B' makes DC compression contact to the center conductor 82 of the GCPW line 80, the conductor portion 30B' makes compression contact with ground conductor strip 84A, and the conductor portion 34C' makes compression contact with ground conductor strip 84B. The metal shielding 40' is designed to also make DC contact to the two outer ground plane strips 64A, 64B and 84A, 84B of the two GCPW lines 60 and 80, and to lateral metal conductor ground strips such as strip 64C extending laterally between the two ground strips 64A, 64B.

To ensure a good 50 ohm match at the vertical junction, the GCPW line, lying under the dielectric 22, is modified for a higher impedance. This impedance modification can be achieved by increasing the gap distance between the GCPW center conductor strip and the adjacent ground plane conductors. This is illustrated in FIG. 2 at exemplary region 56. The higher GCPW impedance line introduces an inductance to cancel out the parasitic capacitance formed at the junction between the GCPW line and the three-wire line, and particularly by the capacitive loading caused by the dielectric 22. The transition between the GCPW lines 60 and 80 through interconnect circuit 20' requires only DC contact without any additional processes or materials such as solders or epoxies.

When embedded in common openings within the dielectric support, a three-wire transmission line with compressible conductors can easily transition into a three-wire dielectric filled transmission line with solid wire conductors, through end-to-end compression contact of the compressible conductors to the solid wire conductors. This transition is illustrated in FIGS. 3A and 3B as transmission line 20". This line 20" is identical to line 20 of FIGS. 1A and 1B, except that the conductors include a solid conductor portion and two compressible portions at the extremities of the solid portions. For example, the center conductor includes a solid portion 32" and compressible end contact portions 32A" and 32B". The compressible portions are formed of thin metal wire densely packed into the opening 26 formed in the dielectric 22, in the same manner as the compressible conductor 32 of the transmission line 20 of FIGS. 1A and 1B. The compressible portions 32A" and 32B" are in direct electrical contact with respective ends of the solid conductor portion 32". An advantage of the conductor comprising a solid conductor portion and compressible portions is that a longer connection length is realizable than with conductors entirely formed of the compressible conductor.

FIGS. 4A and 4B illustrate a low cost alternative embodiment of a three-wire transmission line 20'". This embodiment is identical to the transmission line 20" of FIGS. 3A and 3B, except that the solid center conductor portion of each conductor is replaced with a hollow metal plated plastic tube which extends the length of the transmission line 20'" to form a plated via. For example, the center conductor of the three-wire line is formed by the hollow plated tube 32'", with the compressible conductor portions 32A'" and 32B'" packed within the ends of the hollow opening 32D defined by the tube 32'".

FIG. 5 illustrates in simplified form an RF module 130 comprising stacked microwave integrated circuit substrate boards 132, 134, 136, interconnected by a plurality of interconnect circuits 20'. Thus, for example, the board 132 comprises a high power amplifier (HPA) board, the board 134 comprises a driver/low noise amplifier (LNA) board, and the board 136 comprises a common leg circuit (CLC) substrate, or a substrate with phase shifter and transmit/receive switch circuitry.

The GCPW can incorporate solid metal shielding in the upper sidewall in the area where the invention provides the interconnection. This is different from conventional GCPW which has no upper sidewall shields. FIG. 7 illustrates an alternate embodiment of an interconnect 20"" employing a solid metal shield 40" which encircles the dielectric header element 22 and provides upper sidewall shielding for the GCPW lines. The shield 40" has relieved, open areas 40A" and 40B" defined therein to avoid shorting the respective center GCPW strips 62 and 82 when the substrates 52 and 72 sandwich the interconnect 40". The solid metal shield 40" provides a continuous ground return path between the interconnect and the GCPW lines 60 and 80. Pressure contact is used to attach the interconnect between the two stacked GCPW substrates 52 and 72.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A three-wire microwave transmission line, comprising:
   a dielectric element having formed therein first, second and third openings extending from a first end of said dielectric element to a second end of said dielectric element; and
   first, second and third conductors disposed respectively within said first, second and third openings, said conductors including respectively first, second and third compressible conductor members, said compressible conductor members formed of thin metal wire densely packed within said respective openings, said compressible conductor members each including a first end protruding from said respective openings to form a first set of compressible contacts at said first end of said dielectric element.

2. The transmission line of claim 1 wherein said each of said first, second and third conductors is defined by said respective compressible member, and said compressible members extends through said respective first, second and third opening from said first end of said dielectric element to said second end of said dielectric element, each of said compressible members protruding from said second end of said dielectric element to define a second set of compressible contacts at said second end of said dielectric element.

3. The transmission line of claim 1 wherein said first, second and third conductors respectively further include first, second and third rigid conductor members disposed within said respective first, second and third openings, said rigid conductor members each having a first end in a compression fit with a first end of a corresponding compressible element.

4. The transmission line of claim 3 wherein said rigid conductor members are each a solid metal wire conductor.

5. The transmission line of claim 4 wherein said respective first, second and third conductors further includes respectively fourth, fifth and sixth compressible conductor members each formed of thin metal wire densely packed within a corresponding one of said openings, said fourth, fifth and sixth compressible conductor members each including a first end protruding from a corresponding one of the openings at said second end of said dielectric element by a contact dimension to form a second set of compressible contacts, and a second end of each of said fourth, fifth and sixth compressible members is in a compression fit against a second end of said corresponding solid metal wire conductor in electrical contact therewith.

6. The transmission line of claim 3 wherein each of said rigid conductor members is a hollow tube having a center tube opening and conductive surfaces.

7. The transmission line of claim 6 wherein each of said tubes extends through a corresponding one of said openings from said first end of said dielectric element to said second end of said dielectric element, a second end of said corresponding fourth, fifth or sixth compressible member inserted within a first end of said tube.

8. The transmission line of claim 1 further comprising an electrically conductive shield surrounding a periphery of said dielectric element.

9. A stacked assembly of microwave circuits formed on substrates, comprising:

a first microwave circuit comprising a first substrate having defined on a first substrate surface a first grounded coplanar waveguide (GCPW) transmission line;

a second microwave circuit comprising a second substrate having defined on a second substrate surface a second GCPW transmission line; and an interconnection circuit for providing an orthogonal microwave transition between said first and second GCPW transmission lines, said interconnection circuit comprising:

a dielectric element having formed therein first, second and third openings extending from a first end of said dielectric element to a second end of said dielectric element; and first, second and third conductors disposed respectively within said first, second and third openings, said conductors including respectively first, second and third compressible conductor portions, each including a first end protruding from said respective openings to form a first set of compressible contacts at said first end of said dielectric element, said conductors further including respective fourth, fifth and sixth compressible conductor portions each including a first end protruding from said respective openings to form a second set of compressible contacts at said second end of said dielectric element, said first and second substrates sandwiching said interconnection circuit so that said first set of compressible contacts of said three-wire transmission line is in compressive electrical contact with corresponding ground plane surfaces and a center conductor comprising said first GCPW line, said second set of compressible contacts of said three-wire transmission line is in compressive electrical contact with corresponding ground plane surfaces and a center conductor comprising said second GCPW line.

10. The assembly of claim 9 wherein said compressible conductor portions are formed of thin metal wire densely packed within said respective openings.

11. The assembly of claim 9 wherein said first conductor is defined by said first and fourth compressible conductor portions, said second conductor is defined by said second and fifth compressible conductor portions, and said third conductor is defined by said third and sixth compressible conductor portions.

12. The assembly of claim 9 wherein said first conductor further includes a first rigid conductor member disposed within said first opening, said rigid conductor member having a first end in a compression fit with said first end of said first compressible element and a second end in contact with said first end of said second compressible element.

13. The assembly of claim 12 wherein said rigid conductor member is a solid metal wire conductor.

14. The assembly of claim 12 wherein said rigid conductor member is a hollow tube having a center tube opening and conductive surfaces.

15. The assembly of claim 14 wherein said tube extends through said opening from said first end of said dielectric element to said second end of said dielectric element, and wherein said second end of said first compressible member is inserted within a first end of said tube and said second end of said second compressible member is inserted within a second end of said tube.

16. The assembly of claim 9 wherein said first and said second substrate surfaces are planar surfaces.

17. The assembly of claim 9 wherein said interconnection circuit further comprises an electrically conductive shield surrounding at least a portion of a periphery of said dielectric element, said shield contacting said ground plane surfaces of said first and second GCPW lines.

18. The assembly of claim 17 wherein said shield fully surrounds said periphery, with a first relieved area therein formed adjacent said first end of said dielectric element and a second relieved area formed adjacent said second end of said dielectric element, said first relieved area preventing said center conductor of said first GCPW line from shorting to said corresponding ground plane surfaces of said first GCPW line, said second relieved area preventing said center conductor of said second GCPW line from shorting to said corresponding ground plane surfaces of said second GCPW line.

* * * * *